United States Patent [19]

Ishizuka

[11] Patent Number: 5,757,089
[45] Date of Patent: May 26, 1998

[54] METHOD OF AUTOMATIC WIRING

[75] Inventor: Akio Ishizuka, Tokyo, Japan

[73] Assignee: NEC Corporation, Japan

[21] Appl. No.: 449,278

[22] Filed: May 24, 1995

[30] Foreign Application Priority Data

May 26, 1994 [JP] Japan ................................ 6-134917

[51] Int. Cl.⁶ ........................................ G06F 15/00
[52] U.S. Cl. ........................ 307/147; 364/491; 364/488
[58] Field of Search ........................ 307/147; 364/491, 364/488, 489, 490, 480

[56] References Cited

U.S. PATENT DOCUMENTS

| | | | |
|---|---|---|---|
| 4,823,276 | 4/1989 | Hiwatashi | 364/491 |
| 4,910,680 | 3/1990 | Hiwatashi | 364/491 |
| 5,361,214 | 11/1994 | Aoki | 364/490 |

FOREIGN PATENT DOCUMENTS 274751  12/1991  Japan .

OTHER PUBLICATIONS

A Detailed Router Based on Incremental Routing Modifications: Mighty by Hyunchul Shin, IEEE, and Alberto Sangiovanni –Vincentelli, Fellow IEEE, IEEE Transactions on Computer–aided Design, vol. CAD–6, No. 6, Nov. 1987.

*Primary Examiner*—William M. Shoop, Jr.
*Assistant Examiner*—Jonathan S. Kaplan
*Attorney, Agent, or Firm*—Ostrolenk, Faber, Gerb & Soffen, LLP

[57] ABSTRACT

To prevent obstacles to wiring caused when wiring from other nets pass through the vicinity of a terminal, and moreover, to carry out automatic wiring having shorter wiring length and increased wiring completion rate, when calculating wiring costs of a wiring route of a net, for unwired terminals belonging to other nets, wiring route cost values for the net to be wired are variably assigned depending on distance from these terminals. In other words, in the present invention, cost values are established such that the cost weighting decreases with distance from unwired terminals of other nets. Seen from a different viewpoint, in the present invention, cost values are established such that cost increases for wiring routes passing within a prescribed range of an unwired terminal of another net. Incorporation of the above-described set cost value into the calculation of wiring costs enables automatic wiring that reduces cost, shortens wiring length, and prevents occurrence of unwired nets.

5 Claims, 6 Drawing Sheets

METHOD OF AUTOMATIC WIRING

BACKGROUND OF THE INVENTION

1. Field of the Invention

The present invention relates to a method of wiring design of an integrated circuit, and particularly to a method of automatic wiring for finding a best route using a cost function.

2. Description of the Related Art

In the wiring design of an integrated circuit, there is a method of either wiring a plurality of nets together or wiring nets one at a time, but in the latter case, a previously wired net may obstuct or prevent wiring of a subsequently wired. This problem is further described below.

First, regarding basic concepts in wiring design of integrated circuits, "terminal" refers to the point where a signal is inputted and outputted in a functional element (for example, a NAND gate, an inverter, etc.), and "net" refers to one set of terminals mutually connected by wiring. To efficiently distribute wiring on a chip, the usual method involves predetermining the location in which wiring is to be arranged (wiring grid), the wiring grid normally being arranged at set intervals in horizontal and vertical directions on a chip. The achievement of desired functions in an integrated circuit requires, for example, several thousand functional elements or functional blocks and nets that mutually connect these functional elements or functional blocks.

The maze router is basically a method in which the possible routes between two points are systematically searched and the several thousand nets on a chip are wired one by one in order. More specifically, a maze router catalogues for one net all grid points (intersection points of a grid) at a distance of one wiring grid to which wiring can reach from each terminal. Here, the grid points to which wiring can reach are limited to the ones where wiring is not prohibited or where terminals of other nets do not exist. If there are no grid points that can be reached from a plurality of terminals, the cataloguing proceeds by one wiring grid beyond a previously catalogued attainable grid point.

If a grid point can be reached from two terminals, a wiring route connecting the two terminals can be obtained by tracing the path from each terminal to that grid point. If a wiring route between the two terminals is established, the wiring route connecting these two terminals is regarded as one terminal, and processing is carried out to search for the wiring route between this terminal and the remaining terminal.

Figure 1:
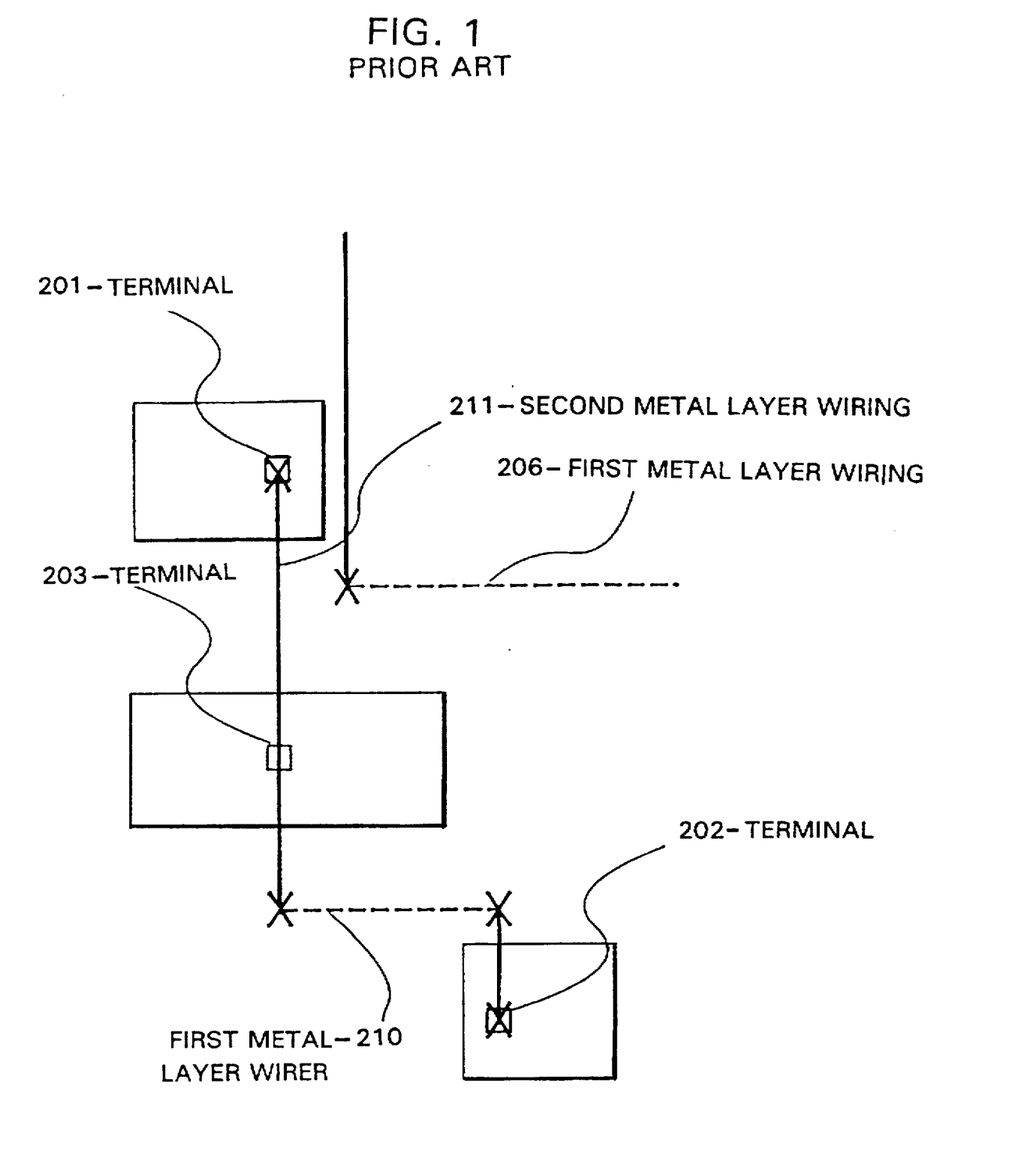
FIG. 1 shows one example of wiring by the maze router of the prior art.

A concrete example of wiring according to the maze router can be explained with reference to FIG. 1. In this figure, terminal 201 and terminal 202 represent terminals mutually wired according to the maze router, heavy solid line 211 represents second metal layer wiring, broken lines 206, 210 represent first metal layer wiring, and the x's represent through-holes connecting the first and second metal layers.

As described hereinabove, the maze router in which net wiring is carried out one at a time in order often gives rise to obstructions of a net wiring by a previously wired net. In FIG. 1, the second layer wiring connecting terminal 201 and terminal 202 passes directly over terminal 203 (lying in the first layer) of another net, thereby obstructing wiring to terminal 203. This type of problem, in which net wiring prevents wiring in another net, is usually caused by a net passing through the vicinity of a terminal.

As one method of the prior art used to solve the above-described problem, wiring-prohibited zones are established in the vicinity of terminals before wiring, thereby preventing passage of another net through the vicinity of a terminal. As an example of this type of method, Japanese Patent Application No. 274751/91 discloses a method in which spheres of influence drawn out from terminals other than a terminal to be wired are established as wiring-prohibited zones. In this patent application, wiring is carried out by dividing the entire chip into small rectangular areas, the length of spheres of influence established in the vicinity of terminals are made a parameter (for example, a percentage of one side of a rectangular zone) and the parameter value is assigned to a wiring processor from a parameter determiner.

Here, "wiring-prohibited zone" refers to a wiring zone necessary for carrying out wiring such as, for example, wiring for executing a desired logic within functional elements or functional blocks, or wiring for providing a power source or ground for functional elements (blocks). Other nets are prevented from passing through such a zone.

According to the wiring method disclosed in the above-described patent application, when wiring one net (called "Net A"), still unwired terminals of terminals of nets other than Net A are noted, and wiring-prohibited zones are established such that wiring for Net A does not pass within prescribed ranges around these yet unwired terminals. Net A is wired only after this process has been carried out for all nets other than Net A.

As wiring routes for Net A, routes are sought which do not pass through the wiring-prohibited zones described above. If such routes are not found, Net A is left unwired. There are various methods for wiring nets that are left unwired. For example, wiring of Net A may be attempted again after restricting the wiring-prohibited zones around terminals, or wiring of Net A may be attempted again after first carrying out wiring of another net. When wiring of Net A is completed, a similar process is carried out for the next net, and this process is repeated for all nets.

However, because wiring-prohibited zones are established in the vicinity of terminals in the above-described method of the prior art, wiring cannot be carried out through any of the vicinities of terminals for which wiring-prohibited zones have been established for other nets, resulting in roundabout wiring in which wiring is greatly detoured or in which many through-holes are used, thereby giving rise to the problem of inferior routing. When one after another wiring route is of poor configuration, it is common for wiring for the entire net to ultimately fail.

Furthermore, in the above-described method of the prior art, wiring-prohibited zones must be established before wiring routes from a terminal are determined, and relatively broad wiring-prohibited zones are frequently established to ensure that wiring can be led out from a terminal, thereby leading to problems not only of roundabout wiring and an increase in use through-holes, but also to an increase in the proportion of unwired nets, because the broad wiring-prohibited zones set for one net prohibit wiring for other nets even in portions unused by that net. In such a case, wiring is again attempted after restricting the wiring-prohibited zones, thereby giving rise to the problem of a time-consuming wiring process.

SUMMARY OF THE INVENTION

The object of the present invention is therefore to solve the above-described problems by providing a method of determining wiring cost and a method of automatic wiring that allow attainment of higher wiring efficiency by shortening wiring length, and that reduce the obstruction of lead-out of wiring from a terminal caused by wiring of a different net, without lengthening wiring, by gauging the trade-off between passage of wiring for another net through the vicinity of a terminal and the detriment to a wiring configuration.

To achieve the above-described object, the present invention provides a method of automatic wiring of terminals in a circuit and includes the steps listed below:

(a) terminal protection costs are established within prescribed ranges from unwired terminals of all nets in the circuit;

(b) a determination is made whether unwired nets exist or not in the circuit, and ending wiring of nets when no unwired nets exist, but if unwired nets do exist in the circuit, the method of automatic wiring of terminals in the circuit is continued;

(c) a net is wired in the circuit by eliminating terminal protection cost established for an unwired terminal of the net; and (d) the net is wired by a wiring route that minimizes a cost function;

(e) a confirmed wiring route of a net is recorded and (f) in a wired net, establishing a terminal protection cost within a prescribed range from an unwired terminal of that net, and return to step (c);

(g) if a search for a minimum-cost wiring route is unsuccessful, then the method requires returning to step (c) after having carried out prescribed unwiring processing.

In the present invention, the cost which varies depending on distance from a terminal is assigned to the terminal.

Also in the present invention, the weighting of cost decreases with distance from a terminal.

Seen from a different viewpoint, in an automatic wiring method that, in seeking a wiring route of a net, seeks a wiring route such that a cost value determined by the configuration of wiring route is a minimum, the present invention provides a method of automatic wiring characterized by the employment of a cost function such that the cost value increases for a wiring route passing within a prescribed range from an unwired terminal of another net.

By establishing a terminal protection cost that depends on distance from a terminal, the wiring cost determination for automatic wiring according to the present invention enables wiring having shorter wiring length and fewer through-holes than the prior art method while achieving an equal or greater completion rate than a wiring method of the prior art in which wiring-prohibited zones are established to prevent obstructions to wiring to a terminal caused by net wiring.

In addition, the automatic wiring method of the present invention not only ensures a high wiring completion rate by selecting wiring routes based on a cost function that depends on distance from a terminal such that wiring is routed through terminal protection zones if the resulting overall wiring cost is low, but also decreases wiring area while enabling high-quality wiring having shorter wiring length as well as fewer through-holes than the prior art method. The automatic wiring method of the present invention achieves a higher wiring completion rate with shorter wiring length and reduces wiring time by making the wiring process more efficient.

The above and other objects, features, and advantages of the present invention will become apparent from the following description based on the accompanying drawings which illustrate an example of a preferred embodiment of the present invention.

DETAILED DESCRIPTION OF THE PREFERRED EMBODIMENTS

An embodiment of the present invention will next be explained with reference to the accompanying figures.

Figure 3:
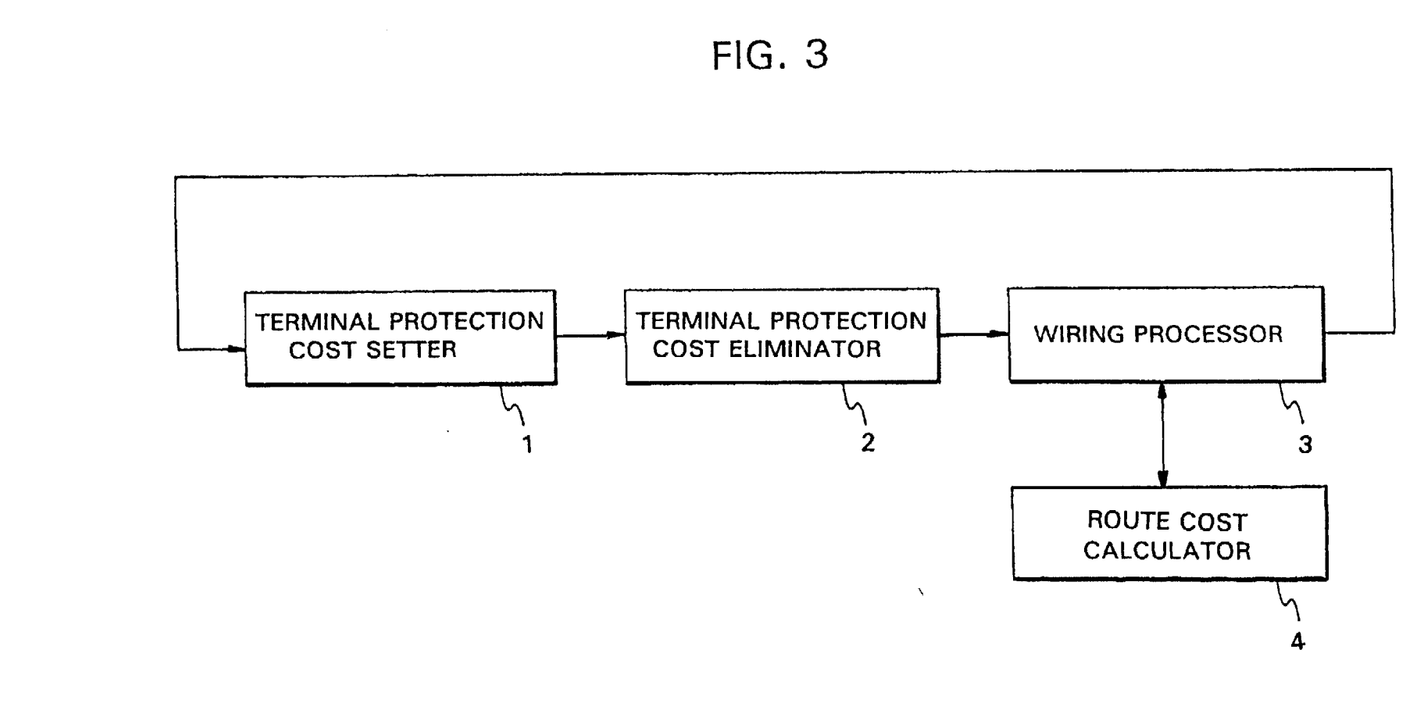
FIG. 3 is a block diagram showing the functional composition of one embodiment of the automatic wiring method of the present invention.
Figure 4:
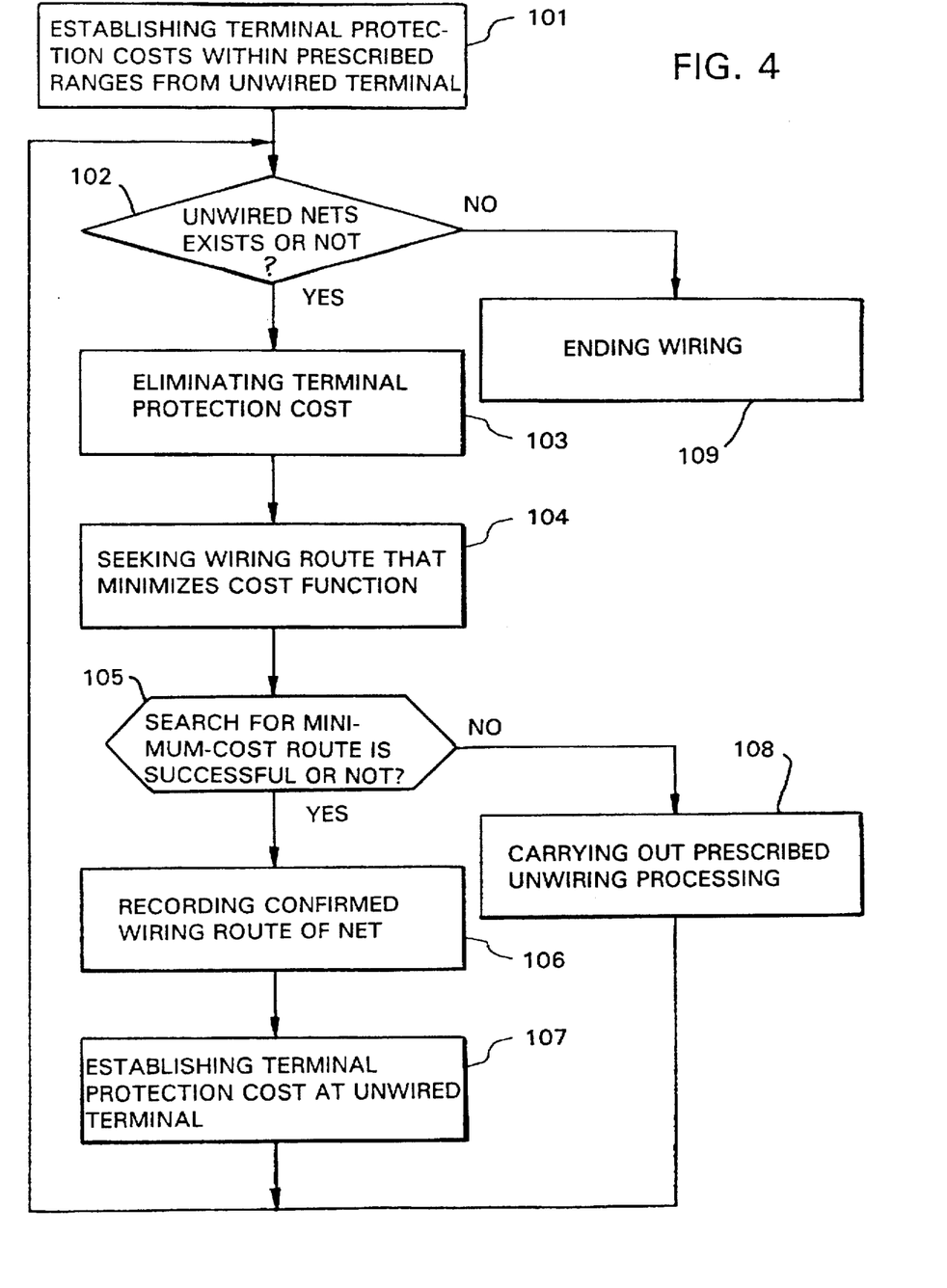
FIG. 4 is a flow chart showing the operation of one embodiment of the automatic wiring method of the present invention.

FIG. 3 is a block diagram showing the functional composition of the automatic wiring method of the present invention, and FIG. 4 is a flow chart showing its operation. As shown in FIG. 3, the automatic wiring method of the present invention is made up of four functional blocks: terminal protection cost setter 1, terminal protection cost eliminator 2, wiring processor 3, and wiring route cost calculator 4.

Wiring processor 3 employs a cost-added maze router in a process to find the minimum cost route. The cost-added maze router employed is a known method such as disclosed by Hyunchul Shin and Alberto Sangiovanni-Vincentelli in "A Detailed Router Based on Incremental Routing Modifications: Mighty" (IEEE Transactions on Computer-Aided Design, Vol. CAD-6, No. 6, November 1987, pp. 942–955). A cost-added segment-searching method other than a maze router may also be used in wiring processor 3. "Segment-searching method" refers to a method by which line segments are generated from both sides to be connected along the x and y directions, and when a line segment from the origin intersects with a line segment from the destination, a route is determined by tracing back from the point of intersection.

The maze router takes two forms: grid wiring in which wiring passes only along an established wiring grid, and gridless wiring in which wiring is effected at wiring intervals determined by design rules without establishing a wiring grid, and either of these two types may be employed. The embodiment described hereinbelow is based on grid wiring, in which a wiring grid is employed.

Wiring processor 3 calculates the route cost at each sought step of the route using wiring route calculator 4 and adds this to the total cost of the route. "One step" refers to advancement by one grid in maze router wiring, and corresponds to one turn and generation of a segment in the segment-searching method. Wiring processor 3 seeks the route among the various wiring routes connecting terminals for which the total cost of the route is a minimum.

The cost of a wiring route includes the cost of advancement in one grid for each layer and each direction, the added cost each time a through-hole is set and a wiring layer changed, and the cost of progression on a grid for which a terminal protection cost is established.

Terminal protection cost setter 1 finds terminals to which wiring is still not connected and sets the protection cost for the vicinity of these terminals. Here, "vicinity of a terminal" and "neighborhood" indicate wiring grid points in a prescribed wiring layer and in a prescribed direction from the terminal which are at a distance within a predetermined prescribed set value.

Figure 5:
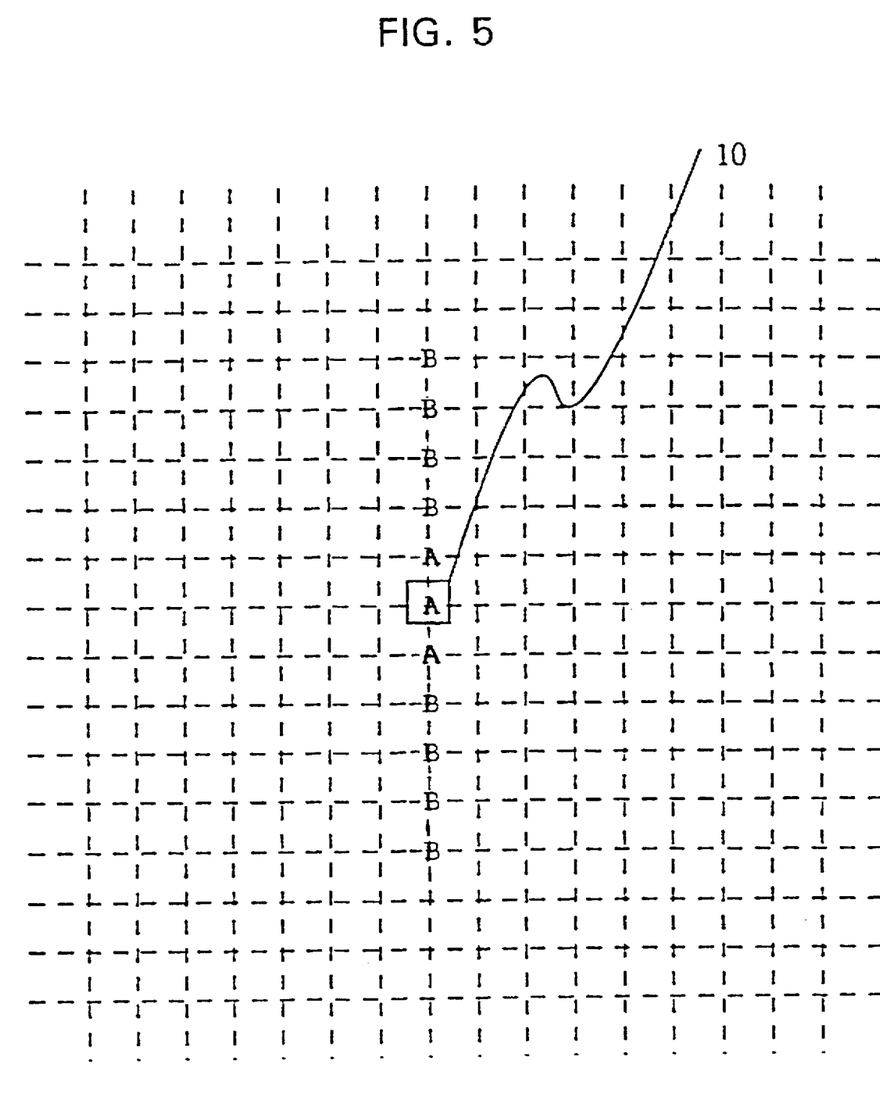
FIG. 5 shows an example of setting terminal protection cost in the automatic wiring cost determination method of the present invention.

"Setting of terminal protection cost" refers to assigning to grid points a code corresponding to distance from a terminal. For example, as shown in FIG. 5, of grids of a second wiring layer on a vertical wiring grid in which terminal 10 is located in a first wiring layer, Code A is assigned to grids lying within one grid in a vertical direction, and similarly, Code B is assigned to grids lying within five grids in a vertical direction.

These grid point codes are consulted at wiring route cost calculator 4 where, for example, cost 100 is added if wiring passes through a Code A grid, and cost 5 is added if wiring passes through a Code B grid.

Wiring that passes extremely close to a terminal is assigned a large cost due to the high possibility that lead-out from the terminal will be obstructed, while wiring that passes somewhat close to a terminal is assigned a low cost because the possibility of obstruction is lower. Because cost is cumulated, the Code B cost is added three times for wiring that passes through three Code B grids.

Because the protection cost in the vicinity of a terminal of a Code A net hinders wiring of the net, the protection cost must be removed. Terminal protection cost eliminator 2 removes protection cost relating to terminals of a net before wiring of the net is performed. If unwired terminals remain in the Code A net after wiring of the net (Code A), the terminal protection cost is set again.

The process of the automatic wiring method relating to the present invention will next be explained with reference to the flow chart in FIG. 4. In FIG. 4, Steps 101, 102, 107 and 109 are conducted at terminal protection cost setter 1 of FIG. 3 and Step 103 is conducted at terminal protection cost eliminator 2. Steps 104–106 and 108 are conducted at wiring processor 3, but cost calculation in Step 104 is processed at wiring route cost calculator 4.

First, terminal protection cost is set for the vicinities of unwired terminals in all nets (Step 101). Next, the processes of Step 102 to Step 108 are carried out repeatedly as long as unwired nets remain. The presence or absence of unwired nets is judged at Step 102, and the process is ended if no unwired nets remain (Step 109).

In wiring one net, terminal protection costs relating to terminals on the net to be wired are first removed (Step 103) since, in wiring the net itself, there is no need to block the approach of wiring routes to terminals.

Next, routes of minimum cost are sought using a wiring method such as a cost-added maze router (Step 104). Here, when wiring passes through a zone in which terminal protection cost has been set, costs are added according to the distance over that zone (such as the number of grids) and the types of protection cost codes.

In such cases as when a terminal is surrounded by a wiring-prohibited zone or wiring of another net, a wiring route will not be found (Step 105), and in such cases, unwired processing is carried out (Step 108). Such processing includes a stripping-wiring method in which the object net is wired after removing wiring of other nets. In the stripping-wiring method, all nets or groups of nets B obstructing the wiring of the net to be wired (here referred to as "Net A") are removed, following which wiring of Net A is carried out. With all obstacles to net A eliminated, wiring for net A can be achieved with certainty. Furthermore, since Net A must not present obstructions to the wiring of Net B, a prescribed terminal protection cost is set for Net B when wiring Net A, and Net B wiring is carried out after Net A wiring is completed.

When a wiring route is found (step 105), the wiring route is recorded (Step 106).

For the wiring of the next net, terminal protection cost is newly set for terminals left unwired within the present net, i.e., the unwired terminals (Step 107). For nets with two terminals, wiring is completed by the processes of Steps 102–106, and the terminals are each other connected, but for nets having three or more terminals, the wiring process is completed by repeating the processes of Steps 102–106 a plurality of times. Accordingly, if wiring of the net is not completed after finishing the process of Step 106, terminal protection cost is set for the unwired terminals of the net. When wiring of this net is completed, setting of the terminal protection cost is not carried out.

Next, the effect of an embodiment of the present invention will be explained using a concrete example of wiring. The following three methods are compared in relation to a wiring zone: (A) Carrying out wiring without establishing terminal protection, (B) Carrying out wiring after establishing wiring prohibition for terminal protection, and (C) Carrying out wiring after establishing terminal protection cost for terminal protection. Method (C) corresponds to the method of the present invention, and Method (B) corresponds to the method disclosed in Japanese Patent Application No. 274751/91.

The results of comparison are shown in Table 1. As shown in the table, wiring in which terminal protection is not established (A), three nets could not be wired because the second layer wiring of another net passed over the terminals of the first layer, preventing wiring connections. To allow comparison of wiring length, the unwired nets were ultimately wired despite overlapping with other nets. No unwired nets remained for either Method B or C, in which terminals were protected. Nevertheless, as shown in Table 1, Method C resulted in shorter wiring length and fewer through-holes than for Method B.

TABLE 1

| wiring method | wiring length | number of through-holes | number of unwired nets |
| --- | --- | --- | --- |
| (A) | 16197 | 429 | 3 |
| (B) | 16430 | 443 | 0 |
| (C) | 16397 | 437 | 0 |

Figure 2:
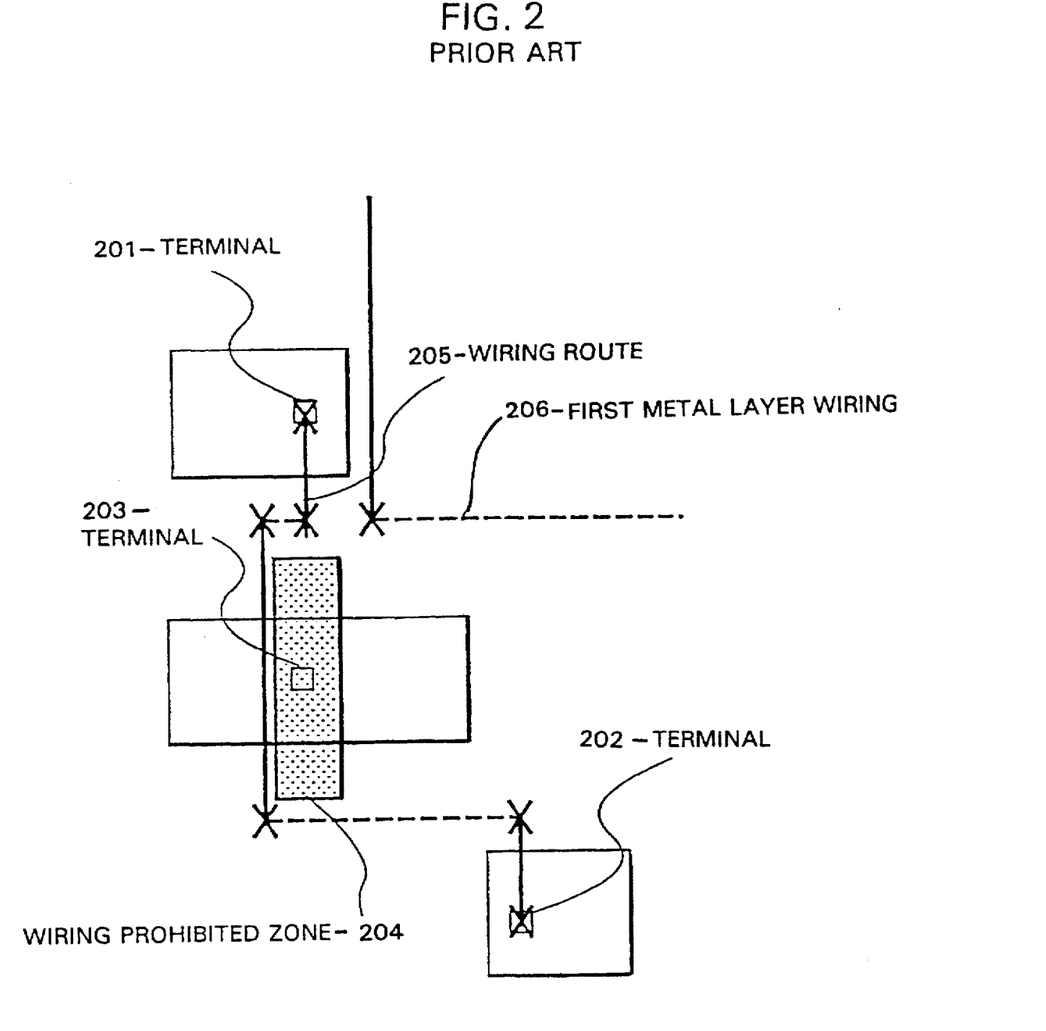
FIG. 2 shows a wiring result according to an automatic wiring method of the prior art.
Figure 6:
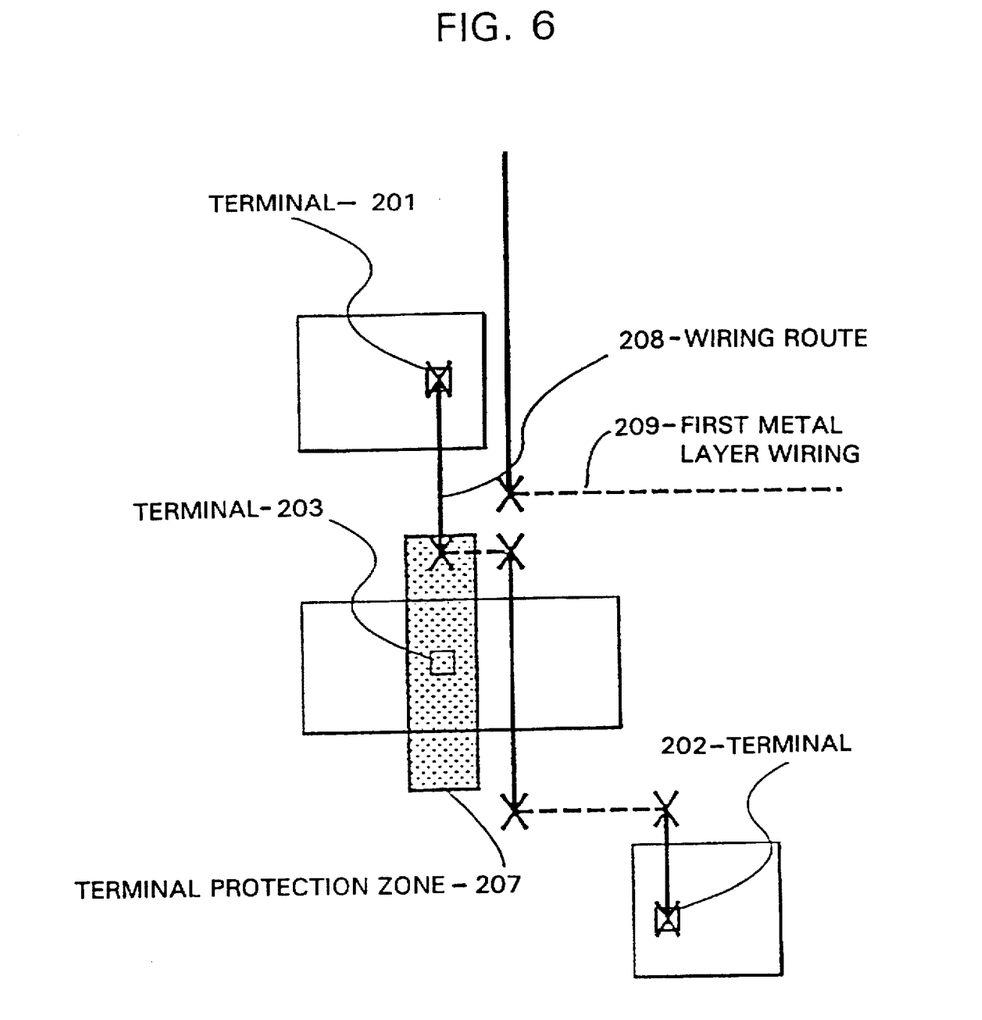
FIG. 6 shows a wiring result in one embodiment of the automatic wiring method of the present invention.

The reason for these comparison results can be explained using the actual wiring results shown in FIGS. 2 and 6.

FIG. 2 shows the result of wiring by the prior art method (B), and FIG. 6 shows the result of wiring by the method of the present invention (C). In FIGS. 2 and 6, the thick solid lines represent the second metal layer wiring, the broken lines represent the first metal layer wiring, the x's represent through-holes connecting the first and second metal layers, and wiring 206 and 209 show wiring that has already been completed.

The prior art method will first be explained with reference to FIG. 2. In FIG. 2, the net (here referred to as Net N) joining terminal 201 and terminal 202 should be noted. Because wiring has still not been connected to terminal 203 at the time of wiring this net, a wiring-prohibited zone 204 is established in the vicinity of terminal 203 to protect the terminal. Wiring-prohibited zone 204 is established for the length of several grids in the direction of wiring lead-out of terminal 203 (i.e., in a vertical direction), and consequently, wiring route 205 is selected as the wiring route of Net N, as shown in the figure. Because wiring route 205 avoids wiring-prohibited zone 204, the route is 2 grids longer than the shortest possible length.

Similarly, in FIG. 6, terminal protection cost is established in zone 207 (also referred to as "terminal protection zone") that lies within a prescribed sphere from unwired terminal 203. In other words, in the wiring method of the present invention shown in FIG. 6, the terminal protection cost is set to a value smaller than wiring for the length of two grids. For example, if the cost of wiring for the length of one grid is 4, the terminal protection wiring cost for one grid is set at 5. In other words, for the terminal protection cost for terminal 203 in the first metal layer, a cost of size 5 is set for grids in the second metal layer lying within two grids in a vertical direction from the location of terminal 203.

Thus, compared with the wiring in FIG. 2, which is two grids longer (with cost overage of 4×2=8), the total cost of wiring into terminal protection zone 207 by the distance of one grid is lower by (8−5=3), and route 208 is therefore selected as the route of Net N. If, for example, wiring were allowed to enter the terminal protection zone by the distance of two grids, the total cost would be (5×2−8=2) greater than wiring route 205 in FIG. 2, and this route is therefore not employed.

Comparing the wiring route of FIG. 2 with the wiring route of FIG. 6, both employ the same number of through-holes and both avoid the vicinity of terminal 203, but the wiring length of route 208 in FIG. 6 is shorter by two grids than wiring route 206 in FIG. 2, and the route of FIG. 6 is a more satisfactory wiring route.

Wiring routes having shorter wiring length and employing fewer through-holes are generally considered better, since a shorter wiring route results in less space consumed by wiring for an entire net, thereby allowing an integrated circuit of smaller area.

Although Method A results in the shortest wiring length and the fewest through-holes, because wiring with overlapping with other nets was necessary to include the three remaining unwired nets, the resulting product is actually unusable in manufacturing.

The automatic wiring method (C) according to the present invention, by employing the cost of protecting terminals, not only enables wiring that leaves no unwired nets, but also avoids the problems of excessive wiring length and through-holes inherent to the prior art wiring method (B).

While the foregoing explanation of the present invention is adapted to a maze router embodiment employing a wiring grid, the present invention is not limited to this mode and includes all modes conforming to the basic principles of this invention. For example, as described hereinabove, the present invention may also be similarly adapted to other wiring methods such as gridless wiring and segment-searching methods.

As explained hereinabove, compared to prior art wiring methods in which wiring-prohibited zones are established around a terminal to prevent obstructions to wiring to the terminal caused by other nets, the wiring cost determination method of the present invention exhibits the effect of allowing wiring with less number of through-holes while achieving an equal or higher wiring completion rate.

In addition, by selecting routes such that wiring enters even into terminal protection zones if the resulting overall wiring cost is small based on a cost function that depends on the distance from a terminal, the automatic wiring method of the present invention not only ensures a high wiring completion rate but provides the effects of enabling high-quality wiring having shorter wiring length and moreover, fewer through-holes than prior art methods, and reducing the necessary wiring area. Furthermore, in addition to the above-described effects, the automatic wiring method of the present invention stipulated in claim 4 enables a more efficient wiring process and a reduction in wiring time.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A method of automatic wiring of terminals in a circuit, comprising the steps of:

(a) establishing terminal protection costs within prescribed ranges from unwired terminals of all nets in the circuit;

(b) judging whether unwired nets exist in the circuit, and ending wiring of nets when no unwired nets exist, and if unwired nets exist in the circuit, continuing the method of automatic wiring of terminals in the circuit;

(c) wiring a net in the circuit by eliminating terminal protection cost established for an unwired terminal of said net; and (d) wiring the net by a wiring route that minimizes a cost function;

(e) recording the confirmed wiring route of the net and (f) in the wired net, establishing a terminal protection cost within a prescribed range from an unwired terminal of that net, and return to step (c);

(g) if a search for a minimum-cost wiring route is unsuccessful, return to step (c) after having carried out prescribed unwiring processing.

2. The method of automatic wiring according to claim 1 wherein the establishment of said terminal protection cost in step (a) to includes assigning to a wiring route a cost, the value of which varies depending on distance from a terminal.

3. The method of automatic wiring according to claim 2 wherein the weight of said cost decreases with distance from said terminal.

4. The method of automatic wiring according to claim 1 wherein said cost in step (d) is such that cost value increases for a wiring route passing within a prescribed range from an unwired terminal of another net.

5. The method of automatic wiring according to claim 4 wherein, in said step (d), a prescribed unwiring process in cases when a search for a minimum-cost wiring route is unsuccessful removes wiring that blocks that wiring route and reattempts wiring.

* * * * *